United States Patent
Nadeau et al.

(10) Patent No.: US 8,836,100 B2
(45) Date of Patent: Sep. 16, 2014

(54) SLOTTED CONFIGURATION FOR OPTIMIZED PLACEMENT OF MICRO-COMPONENTS USING ADHESIVE BONDING

(75) Inventors: Mary Nadeau, Alburtis, PA (US); Vipulkumar Patel, Breinigsville, PA (US); Prakash Gothoskar, Allentown, PA (US); John Fangman, Leesport, PA (US); John Matthew Fangman, Reading, PA (US); Mark Webster, Bethlehem, PA (US)

(73) Assignee: Cisco Technology, Inc., San Jose, CA (US)

( * ) Notice: Subject to any disclaimer, the term of this patent is extended or adjusted under 35 U.S.C. 154(b) by 212 days.

(21) Appl. No.: 12/955,011

(22) Filed: Nov. 29, 2010

(65) Prior Publication Data
US 2011/0127633 A1    Jun. 2, 2011

Related U.S. Application Data

(60) Provisional application No. 61/265,459, filed on Dec. 1, 2009.

(51) Int. Cl.
*H01L 23/06* (2006.01)
*G02B 6/38* (2006.01)

(52) U.S. Cl.
USPC .......... 257/684; 257/432; 257/E31.127; 257/E25.032; 257/E23.179; 385/56; 385/60; 385/65

(58) Field of Classification Search
USPC .......... 257/432, 684, 667, 676, E23.04, 257/E31.127, E23.179, E25.032, E21.505; 385/56, 60, 65
See application file for complete search history.

(56) References Cited

U.S. PATENT DOCUMENTS

| | | | |
|---|---|---|---|
| 5,789,278 A * | 8/1998 | Akram et al. | 438/118 |
| 6,215,946 B1 | 4/2001 | Sherrer | |
| 6,363,201 B2 | 3/2002 | Sherrer et al. | |
| 6,526,204 B1 | 2/2003 | Sherrer et al. | |
| 6,774,415 B2 * | 8/2004 | Fung | 257/244 |
| 6,839,474 B2 | 1/2005 | Steinberg et al. | |
| 6,848,839 B2 | 2/2005 | Steinberg | |
| 6,932,521 B2 | 8/2005 | Campbell et al. | |
| 7,825,501 B2 | 11/2010 | Zhu et al. | |

(Continued)

FOREIGN PATENT DOCUMENTS

| | | |
|---|---|---|
| JP | 06-018654 | 1/1994 |
| WO | WO 2006/081606 | 8/2006 |

OTHER PUBLICATIONS

Myatt, Chris et al., "Optical Fabrication: Optical Contacting Grows More Robust", LaserFocusWorld, Jan. 1, 2006.

*Primary Examiner* — Robert Huber
(74) *Attorney, Agent, or Firm* — Patterson & Sheridan, LLP (57) ABSTRACT

An arrangement for improving adhesive attachment of micro-components in an assembly utilizes a plurality of parallel-disposed slots formed in the top surface of the substrate used to support the micro-components. The slots are used to control the flow and "shape" of an adhesive "dot" so as to quickly and accurately attach a micro-component to the surface of a substrate. The slots are formed (preferably, etched) in the surface of the substrate in a manner that lends itself to reproducible accuracy from one substrate to another. Other slots ("channels") may be formed in conjunction with the bonding slots so that extraneous adhesive material will flow into these channels and not spread into unwanted areas.

15 Claims, 5 Drawing Sheets

(56) References Cited

U.S. PATENT DOCUMENTS

| | | | |
|---|---|---|---|
| 7,943,411 B2* | 5/2011 | Martin et al. | 438/50 |
| 2004/0058475 A1 | 3/2004 | Freund et al. | |
| 2004/0132291 A1* | 7/2004 | Lee et al. | 438/689 |
| 2005/0194840 A1* | 9/2005 | Mori et al. | 307/131 |
| 2006/0220036 A1* | 10/2006 | Lee et al. | 257/81 |
| 2006/0221586 A1 | 10/2006 | Yang | |
| 2008/0035948 A1 | 2/2008 | Shin et al. | |
| 2008/0122088 A1* | 5/2008 | Todd et al. | 257/741 |
| 2010/0072555 A1* | 3/2010 | Meng et al. | 257/369 |

* cited by examiner

SLOTTED CONFIGURATION FOR OPTIMIZED PLACEMENT OF MICRO-COMPONENTS USING ADHESIVE BONDING

CROSS-REFERENCE TO RELATED APPLICATIONS

This application claims the priority of U.S. Provisional Application No. 61/265,459, filed Dec. 1, 2009 and herein incorporated by reference.

TECHNICAL FIELD

The present invention relates to an arrangement for improving adhesive attachment of micro-components in an assembly and, more particularly, to the utilization of specific slotted configurations formed within a surface to which a micro-component is to be attached to improve the quality of the adhesive attachment as well as the accuracy of the positioning of the micro-component with respect to the rest of the assembly.

BACKGROUND OF THE INVENTION

In many integrated circuit multi-component arrangements, there is often a need to utilize epoxy (or any other appropriate adhesive) to join one component to another during various assembly and/or packaging operations. Indeed, and for the purposes of the present discussion, it will be presumed that the joining relates to attaching a micro-component to a supporting substrate. The need to attach a micro-component to a substrate is a common process step in electronic integrated circuit assemblies, optical system subassemblies, opto-electronic arrangements, and the like.

As the size of these micro-components continues to shrink, the need to place the elements with improved alignment accuracy increases. This is particularly true in optical or opto-electronic arrangements, where one or more micro-components forms part of an optical signal path that requires inter-component alignment to maintain the integrity of the signal path. For example, in a silicon photonic assembly, components such as micro-lenses and optical fibers need to be aligned to one another with sub-100 nm positional accuracy as they are attached to a common substrate, such as a silicon-on-insulator (SOI) substrate.

While the ability to accurately place these micro-components on a substrate is a necessary requirement, the maintenance of these positions over the lifetime of the assembly is also important. It is quite possible that a given assembly will be subjected to variations in temperature, humidity and the like over its lifetime, where these environmental changes may degrade the quality of the adhesive bond and cause one component to shift relative to another. One way to address the lifetime issue is to utilize as thin a bond line as possible in the original attachment process (a "bond line" being defined as the thickness of the adhesive between the two surfaces being bonded). It has been found that bond lines on the order of tens of microns will increase the lifetime stability of micro-component assemblies. However, this relatively thin bond line has presented problems in terms of the friction-based restriction of the flow of the adhesive (i.e., molecular flow regime), associated with the relatively large surface areas to be joined relative to the total volume (relatively small) of the adhesive. This frictional problem associated with the small amount of adhesive material then also limits the amount of post-placement adjustment of the micro-component that may be performed, eliminating the possibility of performing active or quasi-active alignment in many optical or opto-electronic systems.

Arrangements exist in the prior art for addressing various issues related to joining components using an epoxy or other adhesive. US Patent Publication 2009/0115039 issued to Z. Zhu et al. on May 7, 2009 is associated with controlling the bond line thickness of the epoxy used in semiconductor device attachments. The Zhu et al. arrangement, however, is concerned with creating relatively "thick" bond lines (as opposed to the "thin" lines desired in the present circumstances) and uses boundary walls around the perimeter of a bonding area to serve as a dam to prevent the epoxy from flowing into unwanted areas.

Many other references exist in the art related to preventing the flow of epoxy into unwanted areas, forming 'wick-stop' trenches and the like. U.S. Pat. No. 6,526,204 issued to D. W. Sherrer et al. on Feb. 25, 2003 is exemplary of this technology, where a trench is formed in a direction "away" from an optical signal path/fiber supporting groove. Thus, any overflow amounts of epoxy will be directed out of the signal path and into wick-stop trench.

These trenches, however, are of limited use in situations where there are multiple components that need to be placed in close proximity. That is, there are many system arrangements where the inclusion of one or more wick-stop trenches requires too much valuable surface area in the arrangement.

A need therefore remains for an arrangement for better controlling the application and control of an adhesive used to join a micro-component to a substrate.

SUMMARY OF THE INVENTION

The needs remaining in the prior art are addressed by the present invention, which relates to an arrangement for improving adhesive attachment of micro-components in an assembly and, more particularly, to the utilization of specific slotted configurations formed within the surface to which a micro-component is to be attached to improve the quality of the adhesive attachment as well as the accuracy of the positioning of the micro-component with respect to the rest of the assembly.

In accordance with the present invention, a plurality of parallel-disposed slots are used to control the flow and "shape" of an adhesive "dot" so as to accurately attach a micro-component to the surface of a substrate. The slots are formed (preferably, etched) in the surface of the substrate in a manner that lends itself to reproducible accuracy from one substrate to another. Additional slots (hereinafter referred to as "channels") may be formed in conjunction with the bonding slots so that extraneous adhesive material will flow into these channels and not spread into unwanted areas. In a preferred embodiment, the channels are formed to extend further into the substrate than the slots so as to ensure that all of the overflow adhesive will be contained.

The plurality of slots may be formed in any desired configuration (i.e., rectangular, circular, etc.) to define the "shape" of the adhesive material. In one embodiment of the present invention the shape is defined to mimic the topology of the surface of the micro-component being attached to the substrate so that the micro-component will naturally "center" itself on the adhesive and provide for self-alignment at the desired location on the substrate.

It is an aspect of the present invention that the number of individual slots forming the plurality of slots, as well as the depth of the slots, allows for the desired thin bond lines to be formed. Additionally, the inclusion of channels allows for adhesive flow below the surface-to-be-joined in the outward direction (i.e., as a result of pressure) or in the inward direction (i.e., as a result of surface tension) to be controlled and restricted in a predictable and reproducible manner.

In one embodiment of the present invention, one or more heater elements (such as resistive strips) may be embedded within one or more slots to allow for localized heating of the adhesive material, changing its viscosity and/or providing curing of the adhesive, as needed. Indeed, by selective control of the heating of various elements, a multiple number of micro-components may be attached to a common substrate, with a heat-sensitive bonding material used to sequence the separate attachment operations. That is, by controlling the turning "on" and "off" of the heater element, a number of separate micro-components may be positioned on a common substrate, with the adhesion of each micro-component performed in a preferred sequence by controlling the temperature of the adhesive in the local area of each component.

It is an advantage of the present invention that when the support substrate comprises a material such as silicon, a standard etch process common in CMOS device fabrication can be used to form the slots. The utilization of a conventional etch process allows for reproducibility of the slot patterns from one substrate to the next, thus improving manufacturability of the assembly.

The use of groups of bonding slots in accordance with the present invention finds use in pure electrical integrated circuit bonding operations, optical assemblies, or opto-electronic arrangements. The adhesive material itself may comprise any suitable epoxy or flowable adhesive as used in the art for this purpose.

Other and further embodiments and aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
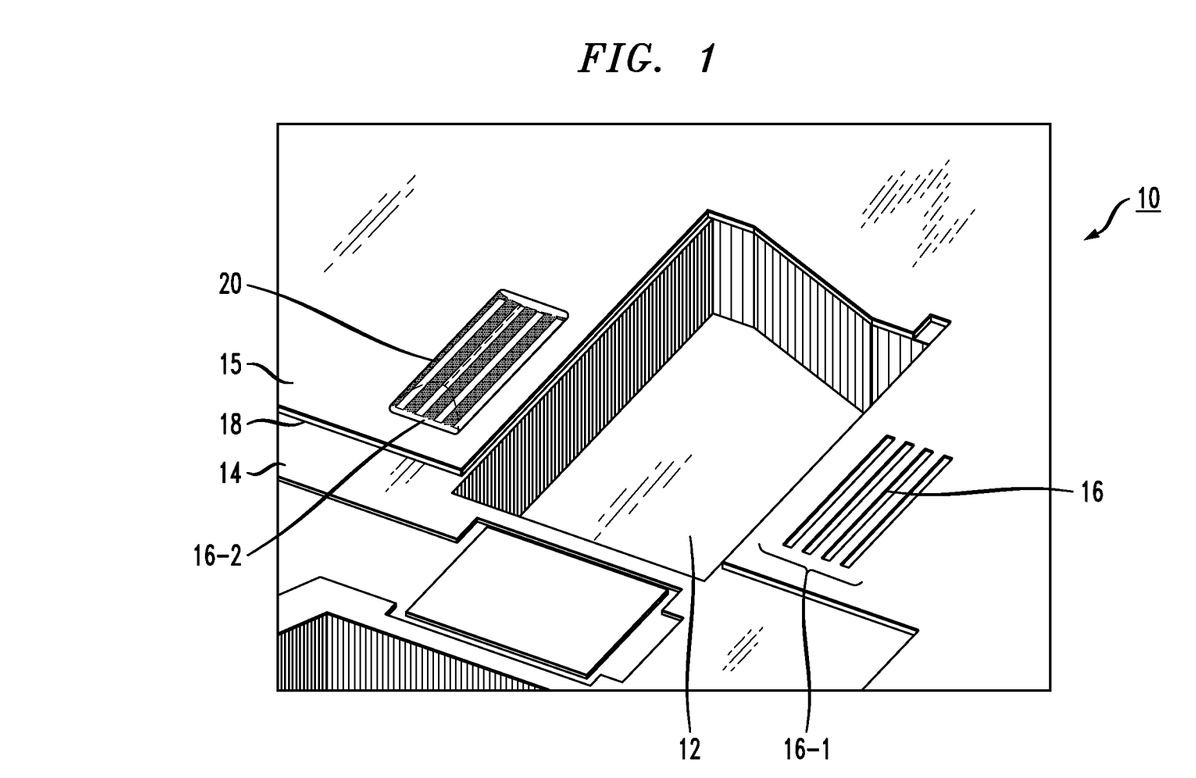
FIG. 1 is an isometric view of a portion of an optical system utilizing pluralities of slots to form adhesive dots in accordance with the present invention.

FIG. 1 is an isometric view of a portion of a silicon-on-insulator (SOI) opto-electronic assembly 10 that is suitable for using the slotted attachment arrangement of the present invention. Assembly 10 includes an etched cavity 12 that is formed in a substrate 14 and used to support a micro-component such as a lens (not shown). In accordance with the present invention, a plurality of slots 16 are formed in a top surface 18 of substrate 14. In one embodiment, a dielectric layer 15 may be disposed across the surface of substrate 14 and slots 16 etched into dielectric layer 15 using standard CMOS lithographic techniques. While the focus of the following discussion utilizes an optical assembly as an example, it is to be understood that the use of groups of slots to provide attachment of a micro-component to a substrate is useful in electrical integrated circuit systems, optical systems or opto-electronic systems.

In the specific arrangement shown in FIG. 1, the plurality of slots 16 comprise a first plurality of slots 16-1 disposed on one side of cavity 12 and a second plurality of slots 16-2 disposed on the opposite side of cavity 12. An adhesive "dot" 20 (such as a prescribed volume of epoxy or any other suitable, flowable adhesive material) is shown as being dispensed onto slots 16-2. The utilization of a plurality of slots of a predefined length and depth (as well as inter-slot spacing), in accordance with the present invention, allows for the quantity of liquid adhesive to naturally take the shape of the slots as a result of surface tension properties.

Figure 2:
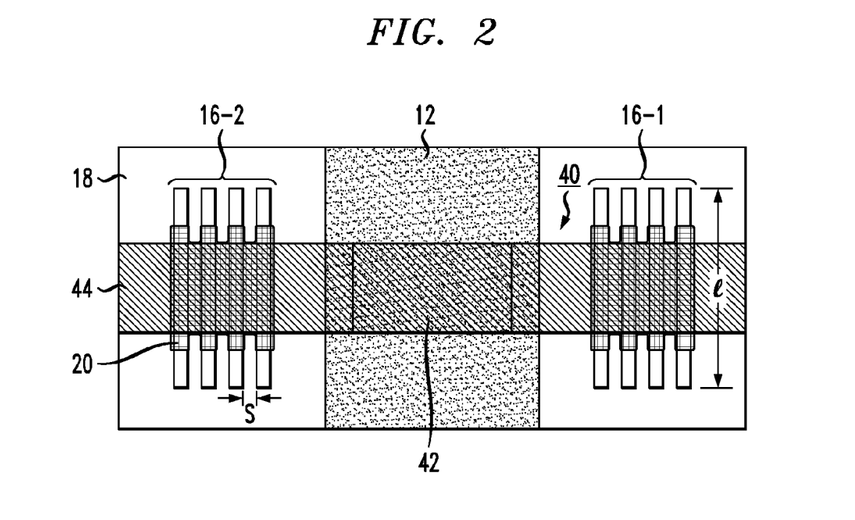
FIG. 2 is a top view, in diagrammatic form, of the arrangement of FIG. 1, with a micro-component positioned to be attached to the optical substrate.

FIG. 2 is a top view, in block diagram form, of the arrangement of FIG. 1, in this case with a micro-component 40 disposed to both fit into cavity 12 and span across slots 16-1 and 16-2 formed in top surface 18 of substrate 14 (particularly, through dielectric layer 15 disposed over substrate 14). The length l and inter-slot spacing s associated with slots 16 is shown in FIG. 2. While in this particular example each slot is formed to comprise approximately the same length and is etched to approximately the same depth, it is to be understood that in its most general embodiment, the slots may comprise varying lengths, depths and spacings, as long as they function to contain the flow of the adhesive material to a region suitable for the attachment of a specific micro-component. Adhesive 20 (such as an epoxy) is shown as the shaded material disposed along and within slots 16. In this example, micro-component 40 comprises an optical lens 42 disposed within a lens holder 44, where the lens itself is positioned to reside within cavity 12 and holder 44 spans across the cavity and is joined to substrate 14 through the use of adhesive 20 disposed along slots 16-1 and 16-2.

Figure 3:
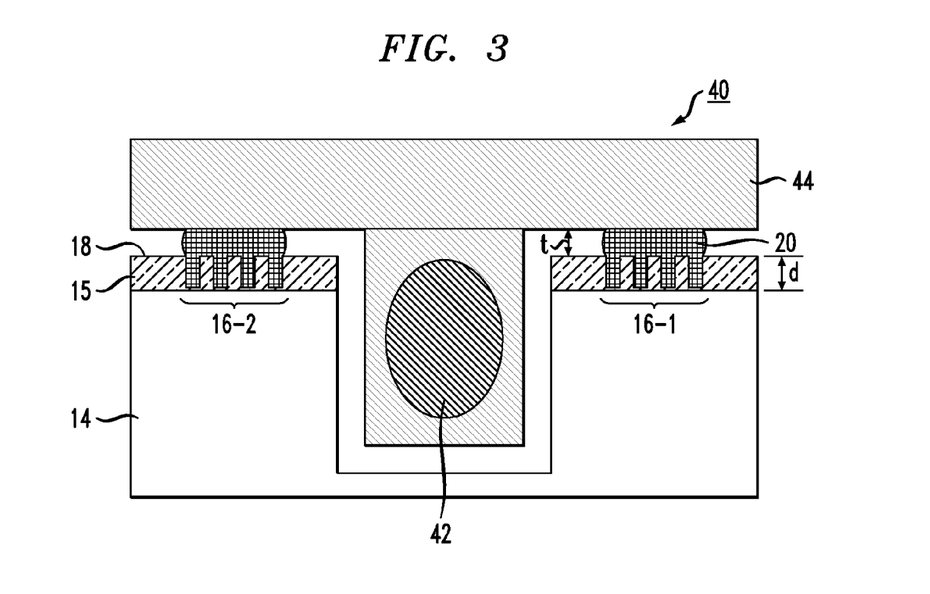
FIG. 3 is a side view of the arrangement of FIG. 2.

The depth d of the created slots 16 is particularly illustrated in FIG. 3. Again, in this example, each slot is etched to the same depth d and is defined as the thickness of dielectric layer 15 since silicon substrate 14 can be used as an etch stop for the process of forming slots 16. In its most general form, the slots may be formed to various depths. Indeed, as will be discussed below, channels may be associated with the slots and may be etched deeper into the substrate. The thickness t of an individual bond line is also shown in this view. In accordance with the present invention, the number of individual slots used to form a given plurality of slots, their length l and spacing s, as well as the depth d of the individual slots, can be designed to increase the ratio of the adhesive volume to the bonding surface area, while maintaining a very thin (i.e., on the order of ten microns or less) bond line in the region of the bond. The size, shape and number of slots may also be optimized to address various fabrication/process issues such as cycle time, yield and cost requirements of a particular assembly. It is an advantage of the use of slots in accordance with the present invention that when a micro-component (such as lens holder 44) is pressed into position over adhesive dots 20, the presence of slots 16 will allow for the adhesive to be retained and spread in a guided fashion.

Figure 4:
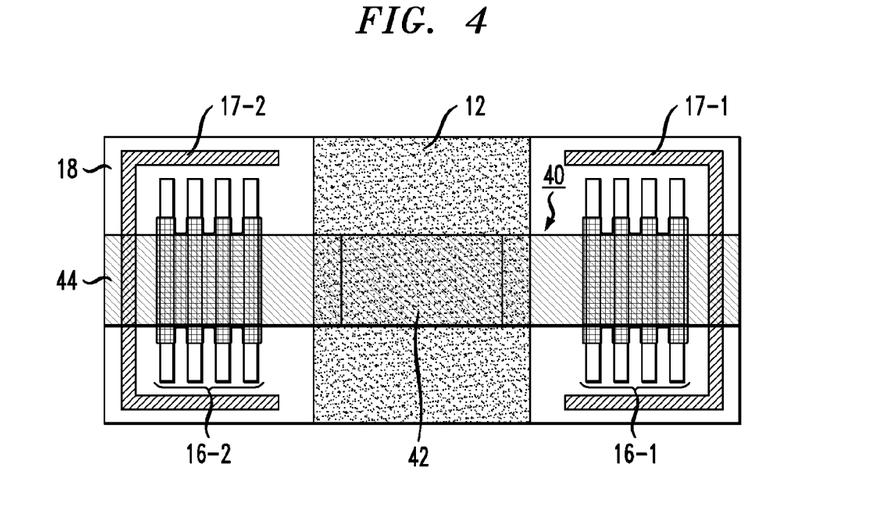
FIGS. 4 and 5 are alternative embodiments of the views of FIGS. 2 and 3, respectively, illustrating the inclusion of channels for containment of overflow adhesive.
Figure 5:
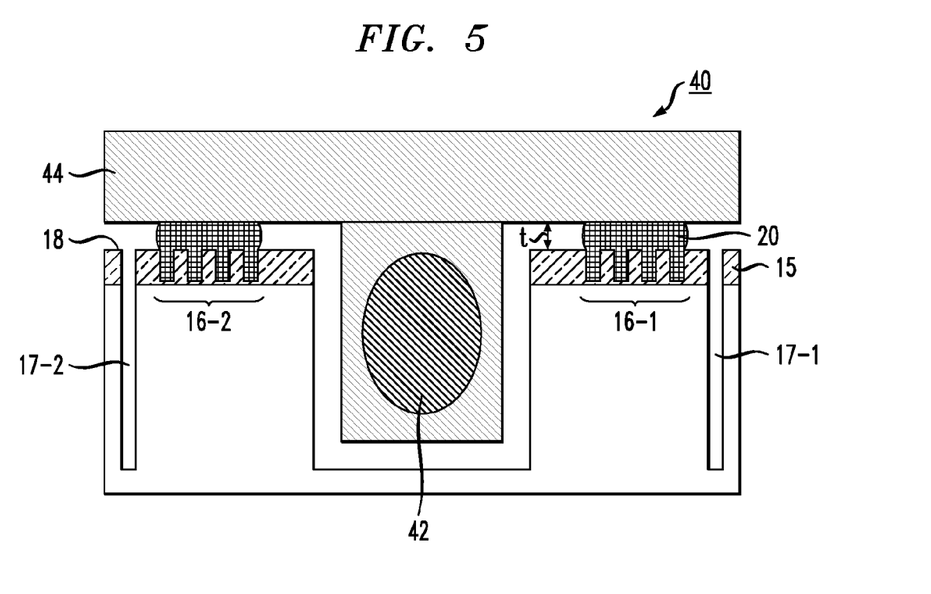

In another embodiment of the present invention, one or more channels may be formed in conjunction with a plurality of slots, where the channels are used to capture overflow adhesive and prevent the flow of the adhesive material into unwanted areas. FIGS. 4 and 5 are top and side views, respectively, of the arrangement of FIGS. 2 and 3, where an overflow channel 17 is formed in conjunction with slots 16. In this particular embodiment, overflow channel 17 is formed to extend a greater depth D into substrate 14. This is considered as a design choice only and, the depth of the overflow channel may alternatively be on the same order as the slots themselves. As with slots 16, channel 17 may be formed using an etching process well-known in CMOS processing (such as deep RIE etching, plasma etching or the like) or any other suitable process. Referring to FIGS. 4 and 5, channels 17 are positioned with respect to slots 16 so that any overflow adhesive 20 will naturally drain into channels 17 and not otherwise spread into unwanted areas across surface 18 of substrate 14.

Figure 6:
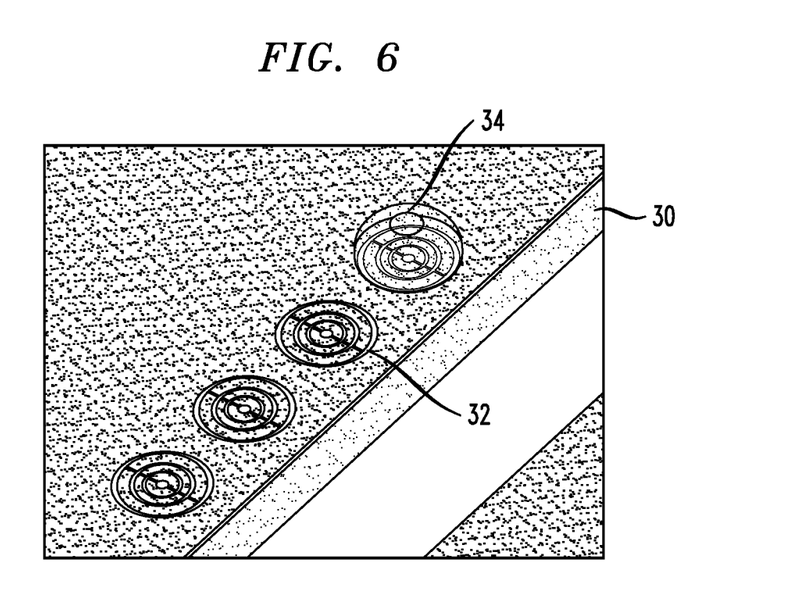
FIG. 6 is an isometric view of an alternative embodiment of the present invention, in this case using a plurality of slots formed in a particular configuration to mimic the surface area of a micro-component being attached to a substrate, the configuration allowing for the micro-component to self-center over an adhesive dot dispensed onto the slots.

As mentioned above, it is a significant aspect of the present invention that the use of slots that may be easily etched in the surface of supporting substrate allows for variously-shaped "dots" of adhesive to be formed, promoting self-centering alignment of a micro-component to the substrate. FIG. 6 illustrates a portion of a different SOI assembly 30, in this case including slots 32 that are formed in a plurality of concentric circles. A dispensed volume of adhesive 34, as shown, will then take on a hemispherical shape, following the contour of the circular base created by slots 32. A specific micro-component (not shown) having a topology in the form of a circular bottom surface will then naturally self-center upon being inserted in place on adhesive 34.

Figure 7:
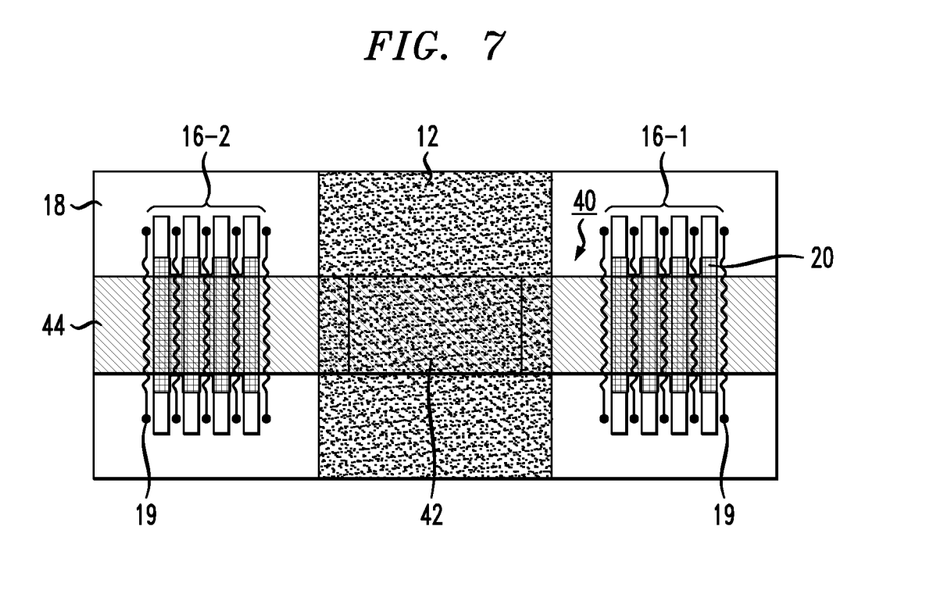
FIG. 7 is a top view of yet another embodiment of the present invention, in this case incorporating a plurality of heater elements with the slots, where localized heating of the adhesive may be useful in controlling the curing of the adhesive.

It is possible to modify the properties of an applied adhesive by changing its temperature. In accordance with another embodiment of the present invention, one or more heater elements (such as resistive strips) may be formed in conjunction with the bond slots and used to change the temperature in the local region of the adhesive. FIG. 7 is a top view of this embodiment of the present invention, showing a plurality of resistive strips 19 disposed in conjunction with slots 16. Materials such as silicon, polysilicon, silicides or metals may be used to form these heater elements. Through additional circuitry (not shown), a current may be passed through strips 19 which will then raise the local temperature in the vicinity of slots 16. Although FIG. 7 shows the use of heater elements positioned adjacent to slots 16, it is also possible to embed a heater element with the slots themselves.

By allowing for the heated adhesive to remain in a viscous state, the position of a micro-component disposed over the adhesive may be adjusted until the desired degree of alignment with respect to the substrate has been achieved. Once the micro-component has been properly aligned, the heater element(s) may also be utilized to activate curing. Additionally, the inclusion of heater elements can be used to provide "local" curing, by turning "on" various ones of the heater elements in a controlled manner. Indeed, by controlling the turning "on" and "off" of strips 19, a number of separate micro-components may be positioned on a common substrate, with the adhesion of each micro-component performed in a preferred sequence by controlling the temperature of the adhesive in the local area of each micro-component.

Figure 8:
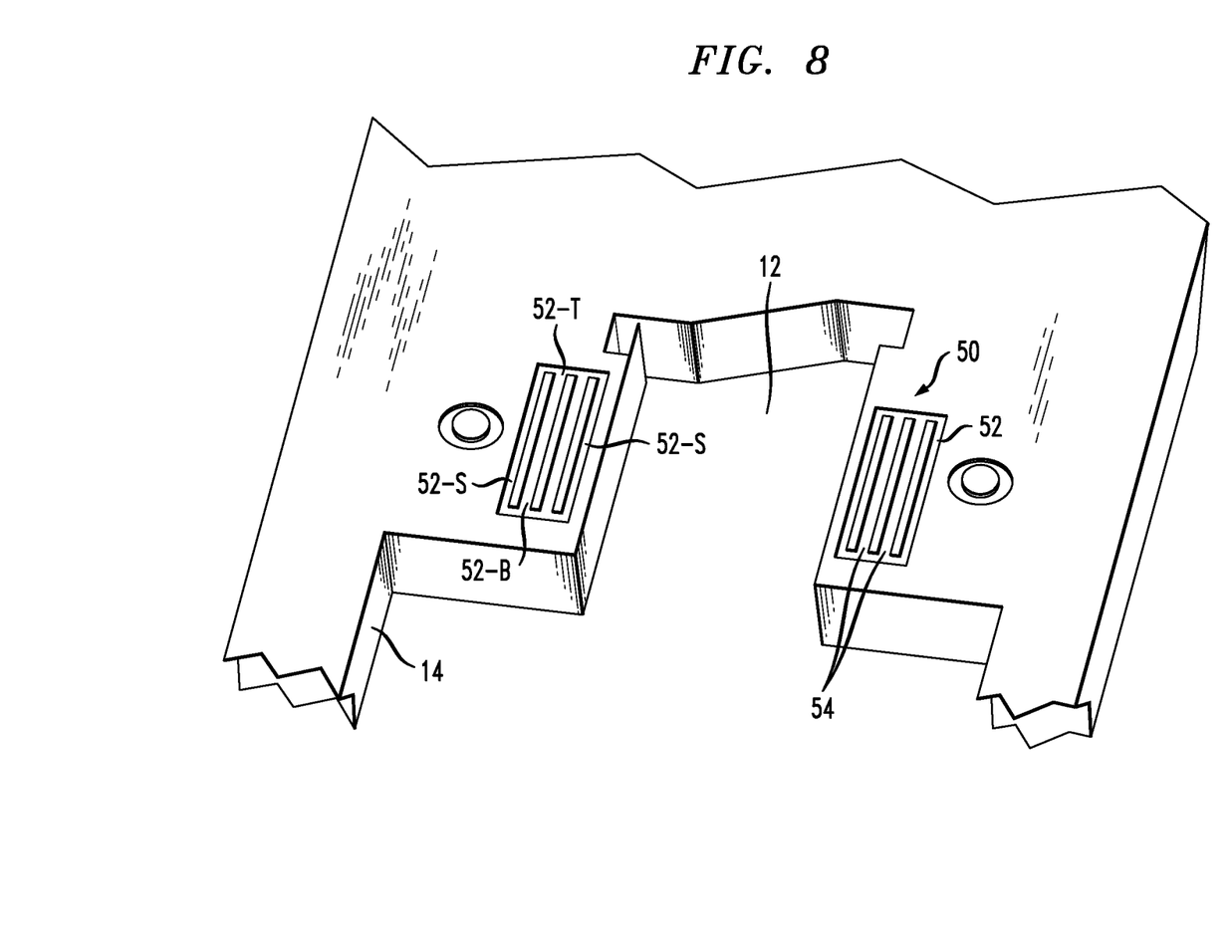
FIG. 8 is an isometric view of yet another embodiment of the present invention, utilizing a plurality of slots in combination with a peripheral guard channel surrounding the slots.

FIG. 8 is an isometric view of an alternative embodiment of the present invention in conjunction with the same assembly configuration (substrate 14, cavity 12 and the like) described in association with the above figures. In this case, the attachment configuration 50 comprises a channel 52 formed around the outer periphery of slots 54 to assist in retaining the liquid adhesive in place. Channel 52 surrounds the edges of slots 54 and is shown as comprising a top channel portion 52-T, a bottom channel portion 52-B and side channel portions 52-S.

In general, the adhesive-bearing slots of the present invention are shown to allow for the controllable and uniform spread of the adhesive material in pre-defined (and confined) areas of interest for bonding. The ability to form a plurality of these slots in a relatively small area has been found to reduce surface friction and allow for the formation of thin bond lines. The presence of the slots themselves increases the surface area/roughness for improving the post-cure joint strength. When used with filled epoxy material, the slots provide additional resistance to movement of the epoxy after curing.

As particularly shown in the illustration of FIG. 6, the ability to form various configurations of the slots allow for the attached component to self-center, providing for (essentially) passive alignment of components to a substrate. Although not explicitly shown, it is further to be understood that the heater elements described above may be used with any slot configuration, including the concentric circular slot arrangement of FIG. 6.

Lastly, while the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the claims appended hereto.

What is claimed is:

1. An arrangement comprising:
a substrate comprising a plurality of parallel-disposed slots formed in a surface of the substrate, the plurality of slots holding a prescribed volume of dispensed liquid adhesive material utilized to bond a micro-component to the substrate,
wherein the substrate comprises at least one channel disposed in the surface adjacent to the plurality of slots, the at least one channel is arranged on the substrate to surround at least two sides of the periphery of the plurality of slots; and
wherein the substrate comprises a semiconductor layer and an insulation layer physically contacting the semiconductor layer, wherein the plurality of slots extends through at least a portion of the insulation layer and respective depths of the plurality of slots are between a surface of the insulation layer and a surface of the semiconductor layer contacting the insulation layer, and wherein the at least one channel extends from the surface of the insulation layer, through the insulation layer, and through at least a portion of the semiconductor layer.

2. The arrangement as defined in claim 1 wherein the plurality of slots are configured to mimic the topology of the surface of the micro-component being bonded to the substrate, the configuration of the plurality of slots providing self-centering of the microcomponent with respect to the plurality of slots upon bonding thereto.

3. The arrangement of claim 1 wherein each slot of the plurality of slots has essentially the same length.

4. The arrangement of claim 1 wherein each slot of the plurality of slots is formed to essentially the same depth between the surface of the insulation layer and the surface of the semiconductor layer.

5. The arrangement of claim 1 wherein the plurality of slots are separated by essentially the same spacing.

6. The arrangement as defined in claim 1 wherein the arrangement further comprises
- at least one heater element disposed in association with a slot of the plurality of parallel-disposed slots to provide local heating of the adhesive material disposed on the associated slot; and
- means for controlling the turning "on" and "off" of the at least one heater element.

7. The arrangement as defined in claim 6 where the at least one heater element is disposed adjacent to an associated slot.

8. The arrangement as defined in claim 6 wherein the at least one heater element is embedded within an associated slot.

9. The arrangement as defined in claim 6 wherein the at least one heater element comprises a resistive element and the means for controlling the turning "on" and "off" comprises a switch for passing current through the resistive element.

10. The arrangement as defined in claim 9 wherein the resistive element is comprised of a material selected from the group consisting of: silicon, polysilicon, silicides, metals.

11. The arrangement as defined in claim 1 wherein the substrate comprises an electrical integrated circuit substrate.

12. The arrangement as defined in claim 1 wherein the substrate comprises an optical system substrate.

13. The arrangement as defined in claim 12 wherein the optical system substrate comprises a silicon-on-insulator (SOI) substrate.

14. The arrangement as defined in claim 1 wherein the substrate comprises an opto-electronic system substrate.

15. An arrangement comprising:
- a substrate comprising a plurality of parallel-disposed slots formed in a surface of the substrate, the plurality of slots holding a prescribed volume of dispensed liquid adhesive material utilized to bond a micro-component to the substrate,
- wherein the substrate comprises at least one channel disposed in the surface adjacent to the plurality of slots, the at least one channel is arranged on the substrate to surround at least two sides of the periphery of the plurality of slots; and
- wherein the substrate comprises a semiconductor layer and an insulation layer disposed on the semiconductor layer, wherein respective depths of the plurality of slots is between a surface of the insulation layer and a surface of the semiconductor layer contacting the insulation layer, and wherein the at least one channel extends from the surface of the insulation layer to below the surface of the semiconductor layer, the at least one channel is defined by opposing surfaces that extend along an entire length of the at least one channel.

* * * * *